United States Patent
O'Dowd et al.

(10) Patent No.: US 7,098,823 B2
(45) Date of Patent: Aug. 29, 2006

(54) REDUCED CHOP RATE ANALOG TO DIGITAL CONVERTER SYSTEM AND METHOD

(75) Inventors: John O'Dowd, Limerick (IE); Thomas J. Meany, Limerick (IE); Tomas Tansley, Kerry (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/005,126

(22) Filed: Dec. 6, 2004

(65) Prior Publication Data

US 2005/0156769 A1 Jul. 21, 2005

Related U.S. Application Data

(60) Provisional application No. 60/536,581, filed on Jan. 15, 2004.

(51) Int. Cl.
*H03M 1/06* (2006.01)

(52) U.S. Cl. .................. 341/118; 341/143; 341/155

(58) Field of Classification Search ............... 341/155, 341/156, 143, 118, 120, 142
See application file for complete search history.

(56) References Cited

U.S. PATENT DOCUMENTS

| | | | |
|---|---|---|---|
| 4,509,037 A * | 4/1985 | Harris ........................ 341/143 |
| 4,906,996 A * | 3/1990 | George ........................ 341/118 |
| 5,477,481 A * | 12/1995 | Kerth ........................ 708/819 |
| 5,675,334 A * | 10/1997 | McCartney ................ 341/118 |
| 6,404,367 B1 * | 6/2002 | Van der Zwan et al. .... 341/143 |
| 6,411,242 B1 * | 6/2002 | Oprescu et al. ............ 341/155 |
| 6,639,532 B1 * | 10/2003 | Liu et al. ................... 341/143 |
| 6,774,822 B1 * | 8/2004 | Thomson ................... 341/61 |
| 2003/0146786 A1 * | 8/2003 | Gulati et al. ................ 330/9 |
| 2004/0141562 A1 * | 7/2004 | Plisch et al. ............... 375/259 |

OTHER PUBLICATIONS

Crystal/Cirrus CS5531—datasheet pp. 14,15 Xernics XEBBLC01/01A datasheet pp. 16-13 to 16-18 and 16-30 to 16-31, no date.

* cited by examiner

*Primary Examiner*—Linh Nguyen
(74) *Attorney, Agent, or Firm*—Iandiorio & Teska

(57) ABSTRACT

A reduced chop rate analog to digital converter technique including selectively weighting input samples to a digital filter, alternately inverting the polarity of an input error into positive and negative error components; and generating the positive and negative error components in a plurality of time response intervals of the digital filter in which the sum of the weights of the positive and negative error components are substantially equal.

25 Claims, 8 Drawing Sheets

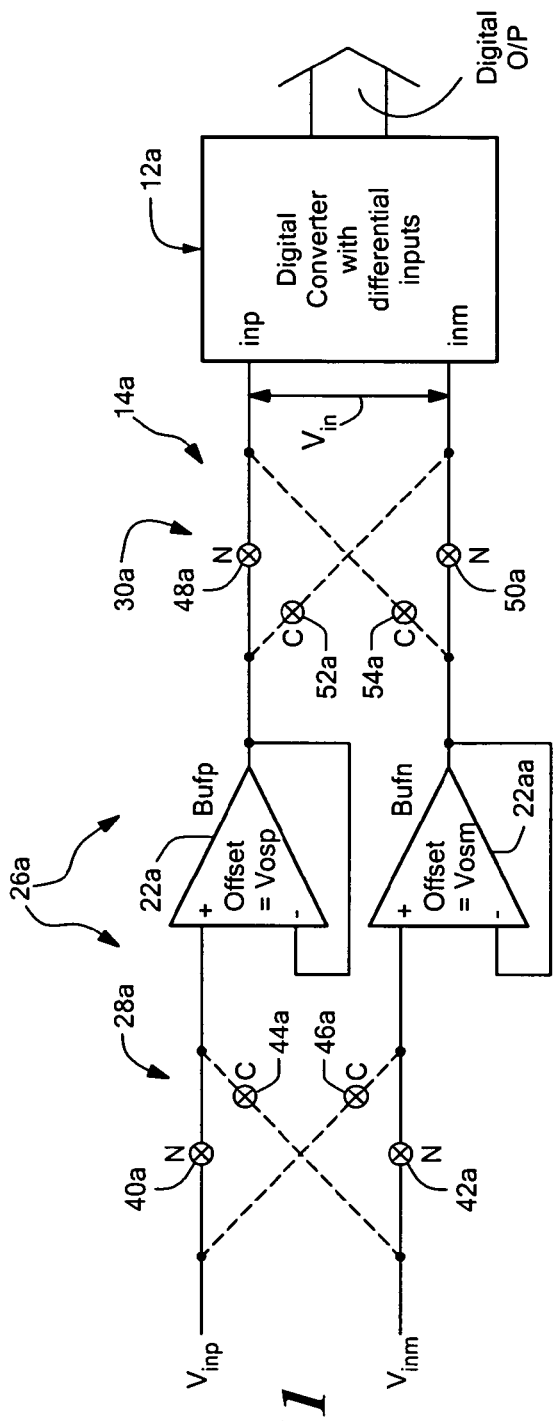
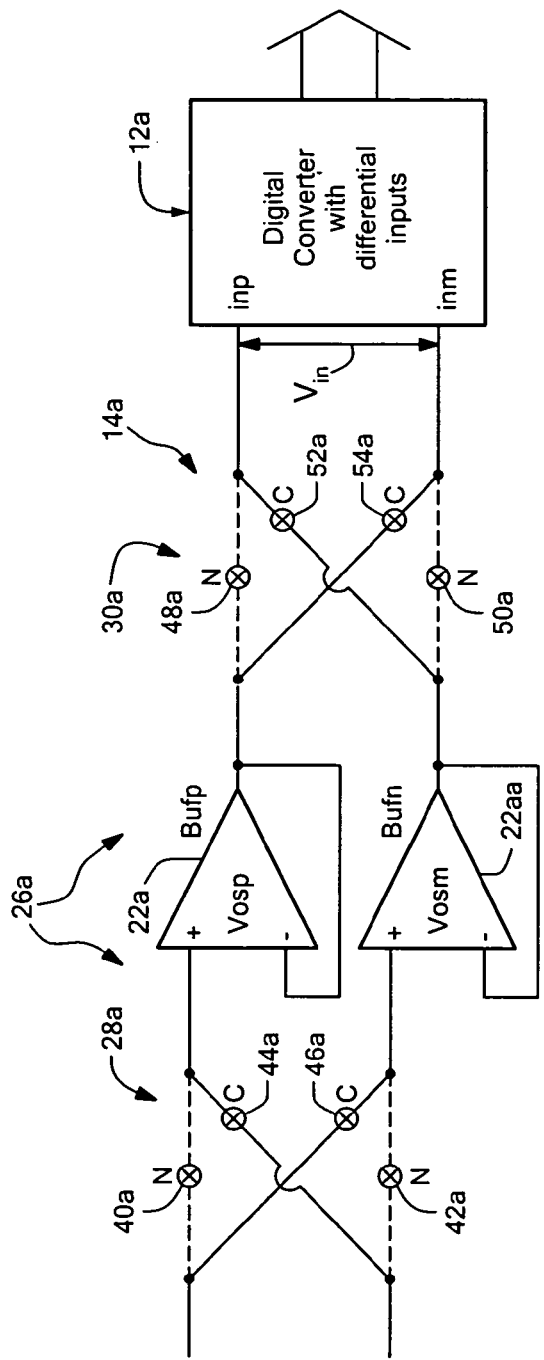
FIG. 11
FIG. 12

REDUCED CHOP RATE ANALOG TO DIGITAL CONVERTER SYSTEM AND METHOD

RELATED APPLICATIONS

This application claims the benefit of U.S. Provisional Application No. 60/536,581 filed Jan. 15, 2004, entitled: "Reduced Rate Chopping in an A/D Conversion System", incorporated by reference herein.

FIELD OF THE INVENTION

This invention relates to a reduced chop rate analog to digital converter system and method, and more particularly to such a method and system in which the digital filter places equal weighting on positive and negative input error components.

BACKGROUND OF THE INVENTION

Chopping is frequently used to eliminate amplifier offset. For example, switches at the input and output of a differential amplifier are operated to reverse the polarity of the offset error so that it appears at the output alternately as positive and negative offsets which are then filtered out to eliminate the offset from the primary signal. Chopping also addresses the 1/f flicker noise problem, which is becoming more of a problem in process geometries in the 0.25 micron range and lower, by transferring 1/f flicker noise to a higher frequency with the offset where it too can be filtered out.

One problem with chopping is that it introduces an input current which causes a reduction in input impedance. Further the input current increases with increasing chop rate. Chopping is often used with analog to digital circuits (ADC's) where the chopping rate is the sampling rate of the ADC. This high rate of chopping produces undesirably large input current and the sampling rate is normally desired to be high. In sigma delta ($\Sigma\Delta$)converters the sampling rate is generally quite high, 100 KHz–10 MHz, but the output conversion rate can be much lower. For high resolution $\Sigma\Delta$ converters the over sampling rate can be 200 to 2000. $\Sigma\Delta$ converters often use a buffer amplifier input to increase the input impedance and chopping can be effected at that buffer amplifier to eliminate its own offset and 1/f flicker noise. Once the positive and negative offsets have been generated by chopping they can be combined or filtered either by the $\Sigma\Delta$ modulator in the $\Sigma\Delta$ converter or the digital filter in the $\Sigma\Delta$ converter or a subsequent filter. Normally a $\Sigma\Delta$ modulator receives two input samples per modulator cycle and the offset voltages can be inverted twice each cycle by chopping. Thus one input sample is proportional to (Vin+ offset) the other (Vin−offset). The first integrator in the $\Sigma\Delta$ modulator sums those samples, that is, the offset voltages are sampled with the input voltage. The integrator thus combines the chopped inputs, cancels the offsets and outputs the sampled input. Another approach is to chop the input at the output conversion rate as disclosed in U.S. Pat. No. 5,675,334. In this approach one conversion includes a positive offset, the next a negative offset so that two full conversions are required to get an output with the offset cancelled.

It is possible to use the digital filter in the $\Sigma\Delta$ converter to remove the chopped offset as in Cirrus Logic's CS5531. In that approach the chop rate is lower than the input sampling rate but it is a fixed rate. The chopping rate then causes a fixed level of undesirable input current independent of output rate. Thus as you reduce the output rate to improve the resolution of the converter the input current and the resulting offset error do not reduce accordingly but remain fixed. Another shortcoming is that this approach only works with digital filters whose time domain response is symmetrical. Still another shortcoming is that the timing of the chopping is also critical: if is not done at the correct time the cancellation of the offset is not complete and an offset still appears at the output.

BRIEF SUMMARY OF THE INVENTION

It is therefore an object of this invention to provide an improved reduced chop rate analog to digital converter system and method.

It is a further object of this invention to provide to such an improved reduced chop rate analog to digital converter system and method with balanced filter weighting.

It is a further object of this invention to provide such an improved reduced chop rate analog to digital converter system and method which functions with filters having non-symmetrical as well as symmetrical time domain responses.

It is a further object of this invention to provide to such an improved reduced chop rate analog to digital converter system and method in which undesirable input current decreases in proportion to the output rate.

It is a further object of this invention to provide to such an improved reduced chop rate analog to digital converter system and method in which the offset is cancelled without reduction in the conversion rate.

The invention results from the realization that an improved technique for eliminating input errors, including 1/f flicker noise and offset, which is effective for symmetrical and non-symmetrical filter time domain responses and in which undesirable input current decreases in proportion to the output rate, can be achieved by chopping the input at a rate at which the positive and negative components define intervals of the time response of the digital filter in which the sum of the weight of the positive and negative components during those intervals are substantially equal.

The subject invention, however, in other embodiments, need not achieve all these objectives and the claims hereof should not be limited to structures or methods capable of achieving these objectives.

This invention features a reduced chop rate analog to digital converter system including an analog to digital converter having a sampling quantizer circuit and a digital filter which selectively weights its input samples in accordance with its time response. There is an input amplifier for coupling an input signal to the analog to digital converter including a chopper circuit for alternately inverting the polarity of an input error into positive and negative error components. A chopper timer defines a plurality of time response intervals of the digital filter and drives the chopper circuit to generate the positive and negative error components in which the sum of the filter weights of the samples of the positive and negative error components are substantially equal.

In a preferred embodiment the input amplifier may be a unity gain buffer or may have gain magnitude of greater than one. The sampling quantizer circuit may include a $\Sigma\Delta$ modulator. The digital filter may include a sinc (sine x/x) filter. It may be a fourth order sinc filter. The input error may include 1/f or flicker noise; it may include offset error. The chopper timer may include a sample counter responsive to a convert start signal to count sample clock signals to define the time response intervals. The chopper timer may include a decoder circuit responsive to the time response intervals for generating normal and chop signals to drive the chopper circuit to generate the positive and negative components in a plurality of time response intervals. The chopper circuit may include first and second switching circuits. The sample counter may be integral with the digital filter. The input amplifier may include a pair of input amplifier circuits each having a chopper circuit for alternately inverting the polarity of an input error of the respective amplifier into positive and negative components, where the analog to digital converter includes a differential input. The input amplifier may include a pair of input amplifier circuits. The analog to digital converter may include a differential input and the chopper circuit alternately swaps the interconnection of the input amplifier circuits with the differential inputs of the analog to digital converter. The input amplifier may include a pair of level shifter circuits one associated with each of the input amplifier circuits. The time response intervals may be equal or not equal.

The invention also features a method of analog to digital conversion for canceling input error including selectively weighting input samples in accordance with the time response of a digital filter and alternately inverting the polarity of an input error into positive and negative components. There is provided a timing signal for generating the positive and negative components in a plurality of time response intervals of the digital filter in which the sum of the weights of the positive and negative components are substantially equal.

This invention also features a reduced chop rate analog to digital converter system including an analog to digital converter having a sampling quantizer circuit and a digital filter which selectively weights its input samples in accordance with its time response and an input amplifier for coupling an input signal to the analog to digital converter including a chopper circuit for alternately inverting the polarity of an input error into positive and negative error components. A chopper timer defines a plurality of time response intervals of the digital filter and drives the chopper circuit to generate the positive and negative error components in which the sum of the filter weights of the samples of the positive and negative error components are substantially equal. The input amplifier includes a pair of input amplifier circuits. The analog to digital converter includes a differential input and the chopper circuit alternately swaps the interconnection of the input amplifier circuits with the differential inputs of the analog to digital converter.

This invention also features a reduced chop rate analog to digital converter system including an analog to digital converter having a sampling quantizer circuit and a digital filter which selectively weights its input samples in accordance with its time response and an input amplifier for coupling an input signal to the analog to digital converter including a chopper circuit for alternately inverting the polarity of an input error into positive and negative error components. A chopper timer defines a plurality of time response intervals of the digital filter and drives the chopper circuit to generate the positive and negative error components in which the sum of the filter weights of the samples of the positive and negative error components are substantially equal. The input amplifier includes a pair of input amplifier circuits. The analog to digital converter includes a differential input and the chopper circuit alternately swaps the interconnection of the input amplifier circuits with the differential inputs of the analog to digital converter. The input amplifier includes a pair of level shifter circuits one associated with each of the input amplifier circuits.

This invention also features a reduced chop rate analog to digital converter system including an analog to digital converter having a sampling quantizer circuit and a digital filter which selectively weights its input samples in accordance with its time response and an input amplifier for coupling an input signal to the analog to digital converter including a chopper circuit for alternately inverting the polarity of an input error into positive and negative error components. A chopper timer defines a plurality of time response intervals of the digital filter and drives the chopper circuit to generate the positive and negative error components in which the sum of the filter weights of the samples of the positive and negative error components are substantially equal. The input amplifier includes a pair of input amplifier circuits each having a chopper circuit for alternately inverting the polarity of an input error of the respective amplifier into positive and negative components; the analog to digital converter includes a differential input.

BRIEF DESCRIPTION OF THE DRAWINGS

Other objects, features and advantages will occur to those skilled in the art from the following description of a preferred embodiment and the accompanying drawings, in which:

FIG. 11 is a schematic block diagram of an alternative embodiment of the input amplifier of FIG. 1 in the normal mode;

FIG. 12 is a schematic block diagram of an alternative embodiment of the input amplifier of FIG. 11 in the chop mode.

DISCLOSURE OF THE PREFERRED EMBODIMENT

Figure 1:
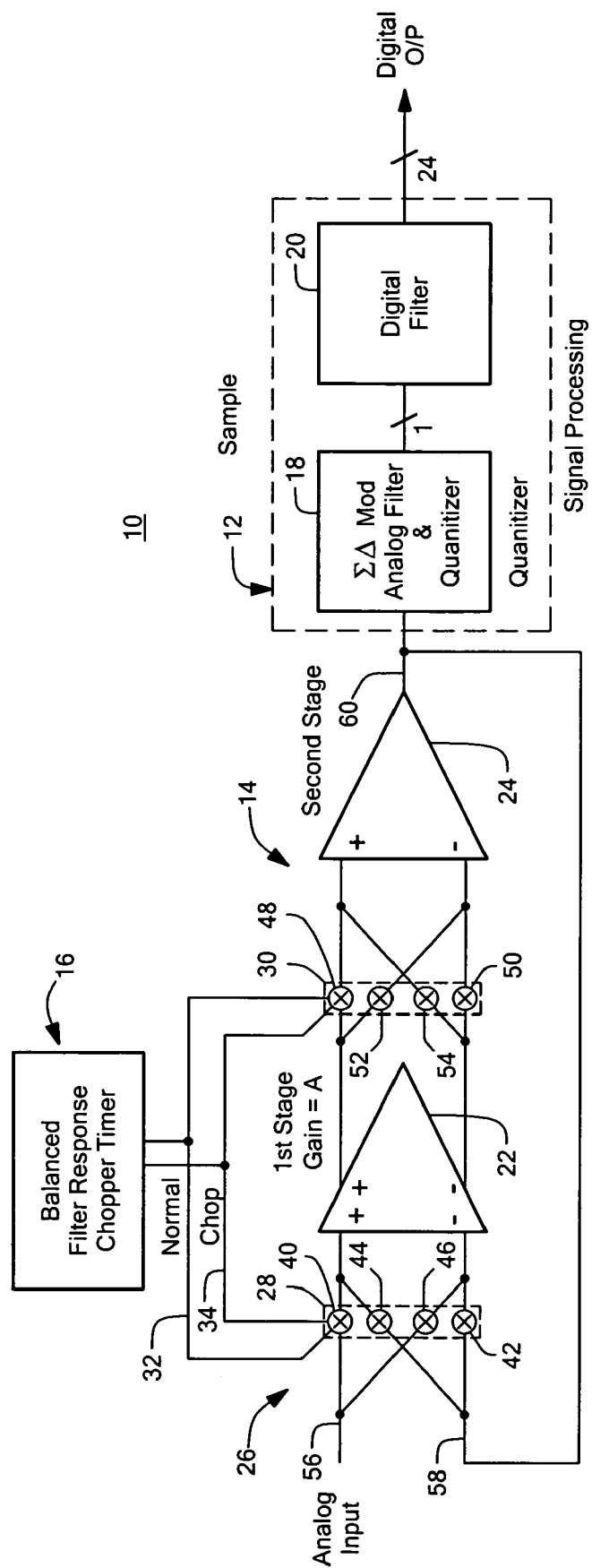
FIG. 1 is a schematic diagram of an analog to digital converter system with reduced chop rate according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 one embodiment of a reduced chop rate analog to digital converter 10 according to this invention including analog to digital converter 12, input amplifier 14, and a balanced filter response chopper timer 16. Analog to digital converter 12 may include a sampling quantizer circuit 18 and digital filter 20. The sampling quantizer circuit may be a sigma delta modulator. The digital filter may be a sinc (sine x/x) filter. Input amplifier 14 may include two stages, first stage amplifier 22, and second stage amplifier 24. There is also a chopper circuit 26 including first switching circuit 28 and a second switching circuit 30. Balance filter response chopper timer 16 provides, alternately, a normal signal on line 32 and a chop signal on line 34 to operate switching circuits 28 and 30. In a normal mode switches 40 and 42 are closed while switches 44 and 46 are open and switches 48 and 50 are closed while switches 52 and 54 are open. Thus in the normal mode the positive input on line 56 is applied through switch 40 to the positive input of amplifier 22 and then through switch 48 to the positive input of amplifier 24: the negative input on line 58 is applied through switch 42 to the negative input of amplifier 22 then through switch 50 to the negative input of amplifier 24. In the chop mode, switches 40 and 42 are open and switches 44 and 46 are closed so that the positive input on line 56 is applied to the negative input of amplifier 22 and the negative input on line 58 is applied to the positive input of amplifier 22. Similarly switches 52 and 54 are now closed and switches 48 and 50 are now open. Thus the positive output of amplifier 22 is provided by switch 52 to the negative input of amplifier 24 and the negative output of amplifier 22 is provided through switch 54 to the positive input of amplifier 24. In this way the inputs are flip-flopped or alternated and the output on line 60 from second stage amplifier 24 provides an output signal which includes the input signal plus the offset error (Vin+offset) and alternately the input signal minus the offset error (Vin−offset).

However, offset error is not the only error that could be corrected in accordance with this invention, for example, the 1/f flicker noise may also be corrected in this way. In either case there alternately appears on output line 60 the negative and the positive error values for those errors be they offset, 1/f or both. Flicker noise (1/f) is generally introduced by the first stage amplifier 22. The chopping circuit as described corrects for errors in first stage amplifier 22 only, and not for errors in second stage amplifier 24. However, the offset and 1/f errors introduced by the second stage are not significant if the first stage has high gain, as is normally the case.

Figure 2:
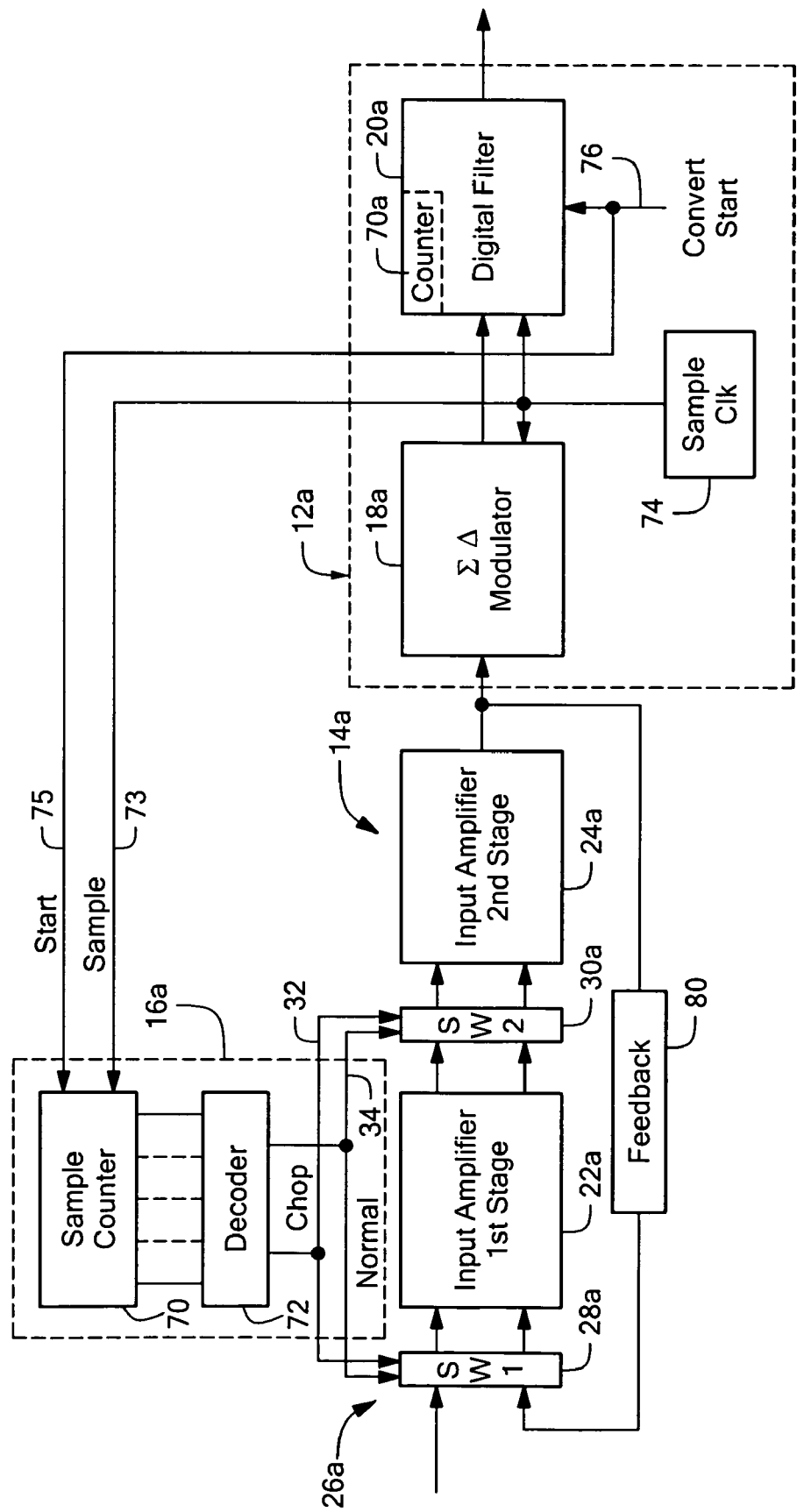
FIG. 2 is a schematic diagram of the analog to digital converter system with reduced chop rate of FIG. 1 showing the balanced filter response chop timer in greater detail.

Balanced filter response chopper timer 16a, FIG. 2, may include a sample counter 70 and decoder 72. Sample counter 70 counts the sample pulses on line 73 coming from sample clock 74 which drives the sampling by the sigma delta modulator 18a, for example, and also drives digital filter 20a. Counting is started with the arrival of the start signal on line 75 from the convert start derived directly from the convert start signal on line 76 which is the signal that begins operation of digital filter 20a. The convert start signal may come from an outside source or internally as also the sample clock 74.

Digital filter 20a may be a sinc filter as previously described which includes a number of integrators and differentiators. For example, a third order sinc filter would include three integrators and three differentiators, a fourth order would include four integrators and four differentiators. Or another kind of digital filter may be used, for example, the differentiators may be eliminated from a sinc filter to create an integrator-only filter with one or a cascade of integrators. The particular type of filter is not important. A feedback circuit 80 may be employed if the input amplifier 14a provides a gain magnitude greater than one. If it were a unity gain amplifier no feedback circuit would be required. The second switching circuit 30a may be incorporated in the second stage amplifier 24a or it may be incorporated in the first stage amplifier 22a and the second stage 24a may be done away with. Also sample counter 70 may be implemented as well in digital filter 20a.

Figure 3:
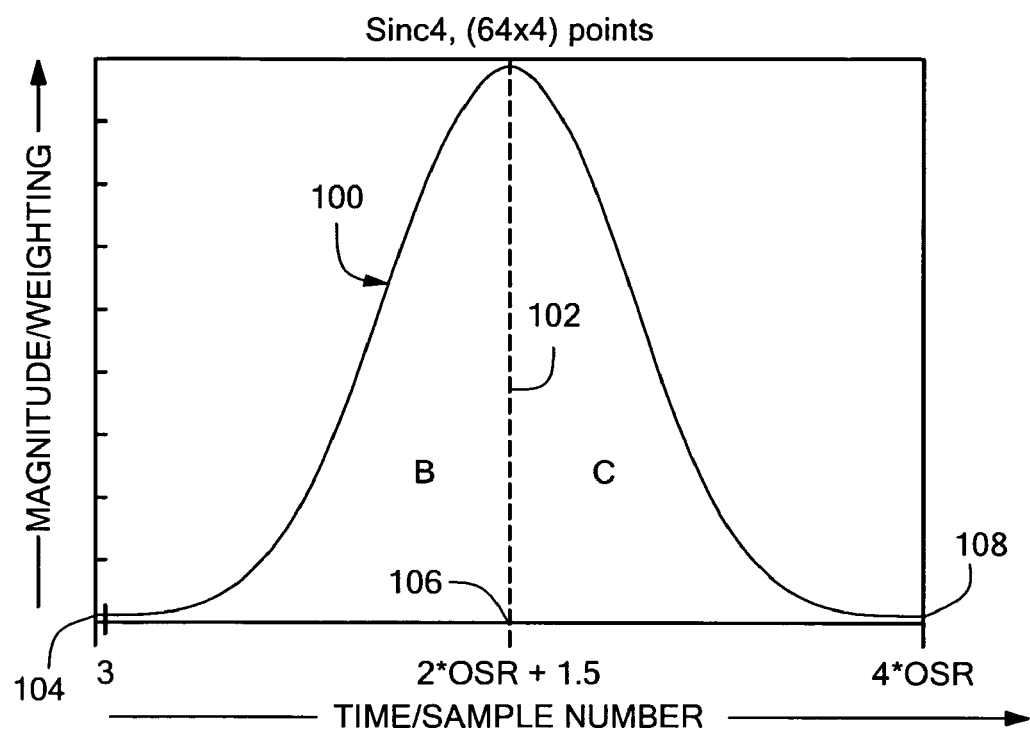
FIGS. 3 and 4 are illustrations of filter time responses chopped into two intervals and four intervals, respectively.

Sample counter 70 in accordance with this invention, divides the time response of digital filter 20a into a number of intervals as it alternates the polarity of the error signal, for example, the offset error. This is done through decoder 72 which responds to the designated counts representing transitions between the intervals to create the chop and normal signals on lines 34 and 32, respectively. The intervals are thus not fixed but are relative to the timing of the samples themselves. For example, in FIG. 3, a time response 100 for a fourth order sinc filter is shown as having two portions labeled B and C. The sum of the weights of the positive components of the error signal in B are equal to the sum of the weights of the negative components in interval C. B and C are balanced and symmetric about the axis 102. In FIG. 3 the conversion cycle is equal to four over sampling rate cycles or 4 OSR since this is a fourth order sinc filter response. Because there are three (3) null samples at the start, the central axis 102 is not an exactly half of 4 OSR or 2 OSR, it is at 2 OSR plus 1.5. In this arrangement the chopper is driven by the balanced filter response chopper timer 16a to, for example, remain in the normal mode providing a positive error signal from the outset at 104 to 2 OSR plus 1.5, point 106. At time 106 it then switches to the chop condition and remains there until the 4 OSR point at 108. The chopping of the signal in correspondence with the balancing of interval B and C causes B and C to have, as shown in FIG. 3, an equal area under the curve but what it really represents is that the sum of the weights of the positive and the negative components of the error signal represented by B and C are balanced or equal. This balancing of the filter weighting occurs according to this invention with filters having asymmetrical as well as symmetrical time domain responses.

In contrast the prior art does not use this delay of 1.5 samples. As a result the weight of the positive and negative components of the error signal are not balanced and do not cancel. Therefore, some portion of the error signal will appear at the system output.

Figure 4:
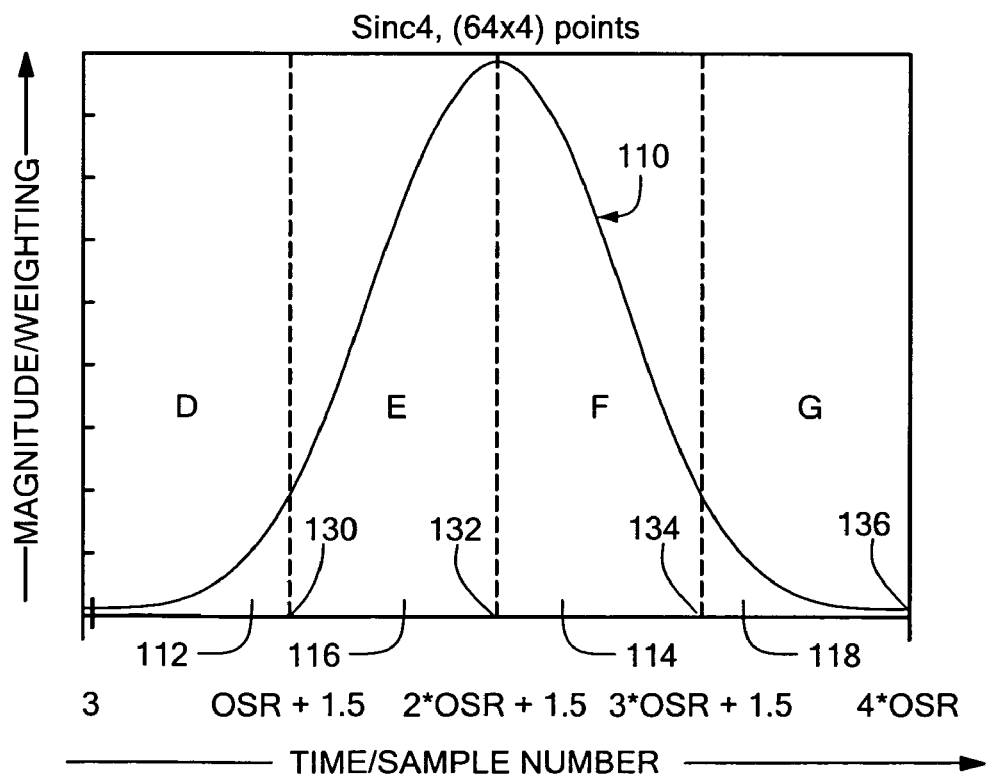

The application of the invention is not limited to simply two intervals in which the sum of the weights of the positive and negative components are equal. Any number of intervals may be used. For example, in FIG. 4, a fourth order sinc filter is shown in which there are four intervals created D, E, F, and G over the time of the filter response 110. Here again the sum of the weights of the positive portions under the response curve 110, portions 112 and 114, are equal to the sum of the weights of the negative portions 116 and 118. Again time response 110 has been shifted by three samples because of the initial null points.

Figure 5:
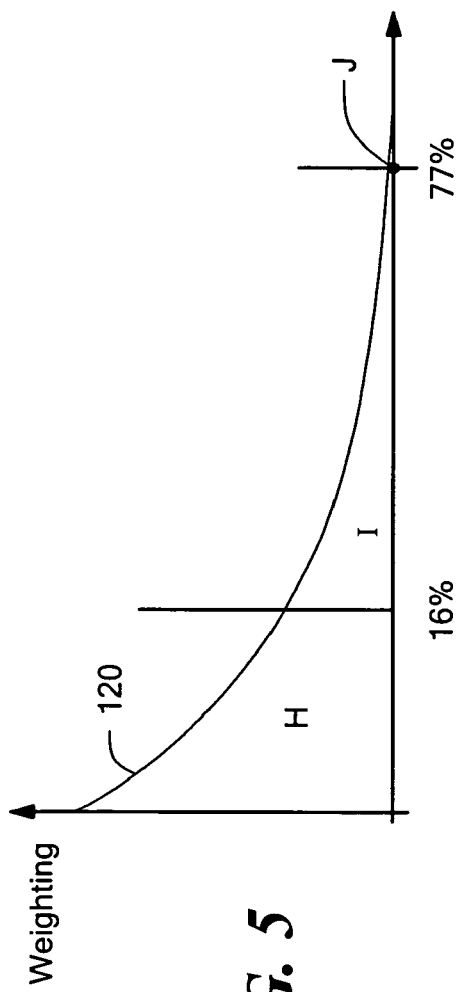
FIG. 5 is an illustration similar to FIGS. 3 and 4 of the filter time response of an integrator-only filter chopped into three intervals.

The application of the invention to asymmetric or non-symmetric time responses is shown in FIG. 5 where the time response 120 for an integrator-only filter has been divided into three intervals H, I and J, where H and J are positive and I is negative. Here the balanced filter response chopper timer 16a provides the normal mode of operation for up to 16% of the sampling time H, then switches to the chop mode I for 61% more and at the 77% sample point switches back to the positive at during interval J. No further transition is needed at the 100% point since the H interval immediately following J is positive once again.

Figure 8:
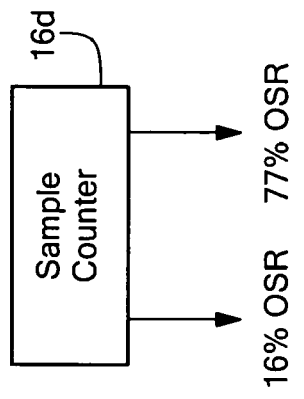
FIGS. 6–8 are schematic diagrams of the sample counters corresponding to the time response intervals in FIGS. 3–5, respectively.
Figure 7:
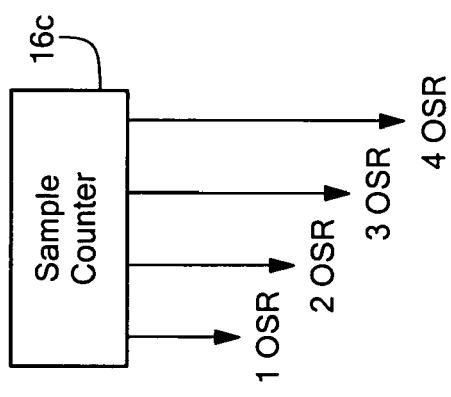
Figure 6:
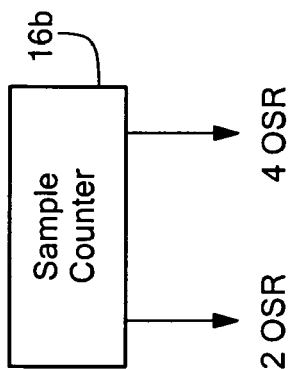

Decoder 72 responds to the output of sample counter 70, FIG. 2, to generate the normal and chop signals on lines 32 and 34, respectively. For example, with sample counter 16*b*, FIG. 6, which corresponds to time response 100, FIG. 3, sample counter 16*b* has an output at 2 OSR and 4 OSR. Sample counter 16*c*, FIG. 7, corresponding to time response 100, FIG. 4, has four outputs, 1 OSR, 2 OSR, 3 OSR, and 4 OSR at points 130, 132, 134, and 136 respectively. Actually those points are 1 OSR+1.5, 2 OSR+1.5, 3 OSR+1.5 and 4 OSR in order to accommodate the initial null points. Sample counter 16*d*, FIG. 8, has two outputs, one at 16% OSR and one at 77% OSR. The first output provides the positive component during interval H while the transition at the 16% point determines the interval I which is a negative component that continues until the 77% point, after which there is a transition giving a positive output for interval J until the 100% point. The subsequent conversion restarts with the H interval which is of the same positive polarity as J and no future transition is required at the 100% point.

Figure 9:
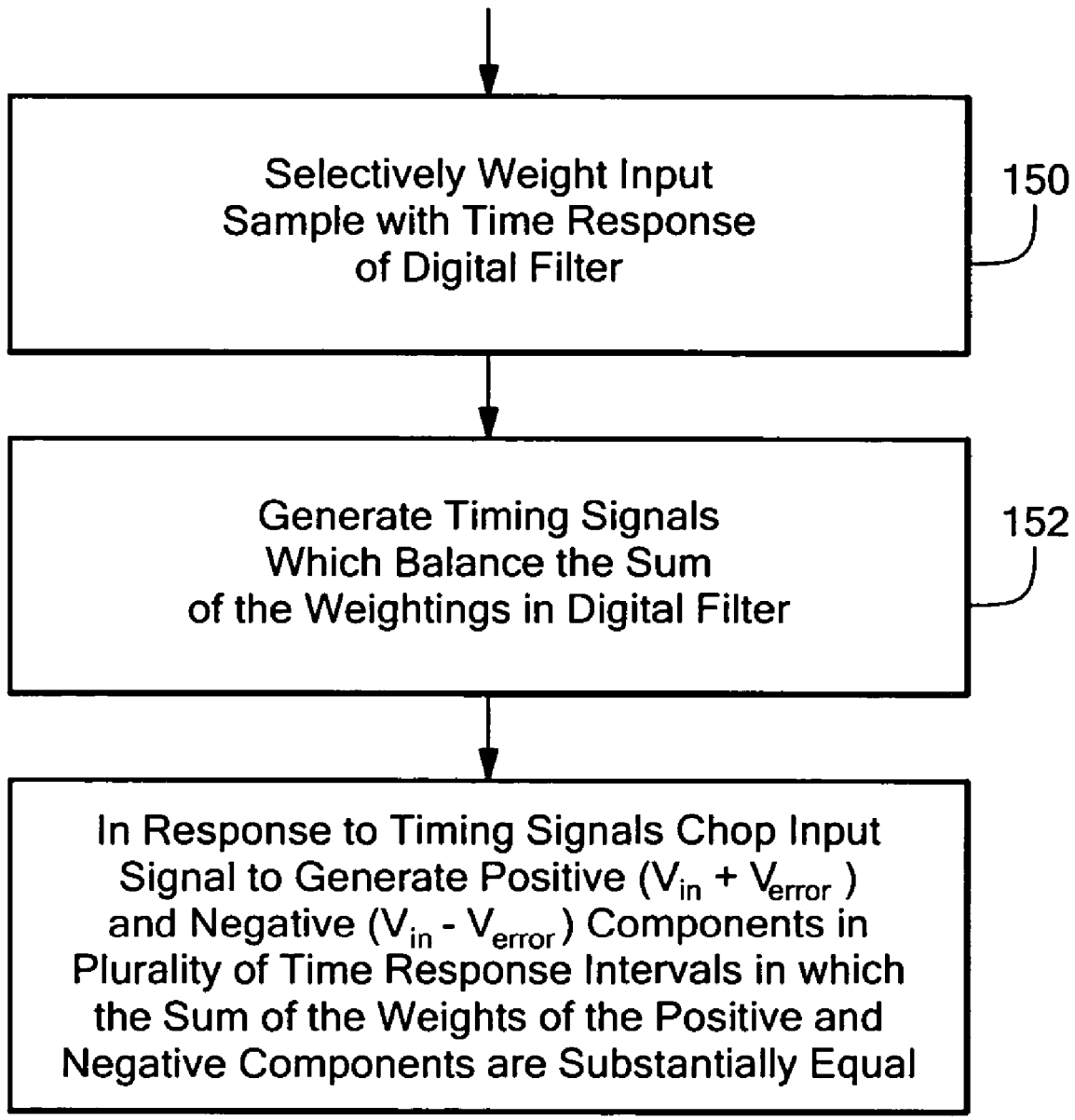
FIG. 9 is a simplified flow diagram of the method according to this invention.

The method of this invention may be practiced with any suitable hardware and includes the steps of selectively weighting the input samples with the time response of a digital filter 150, FIG. 9 and generating timing signals which balance the sum of the weightings in digital filter 152. In response to the timing signals the input signal is chopped to generate positive (Vin+error) and negative (Vin−error) components in a plurality of time response intervals in which the sum of the weights of the positive and negative error components are substantially equal.

Figure 10:
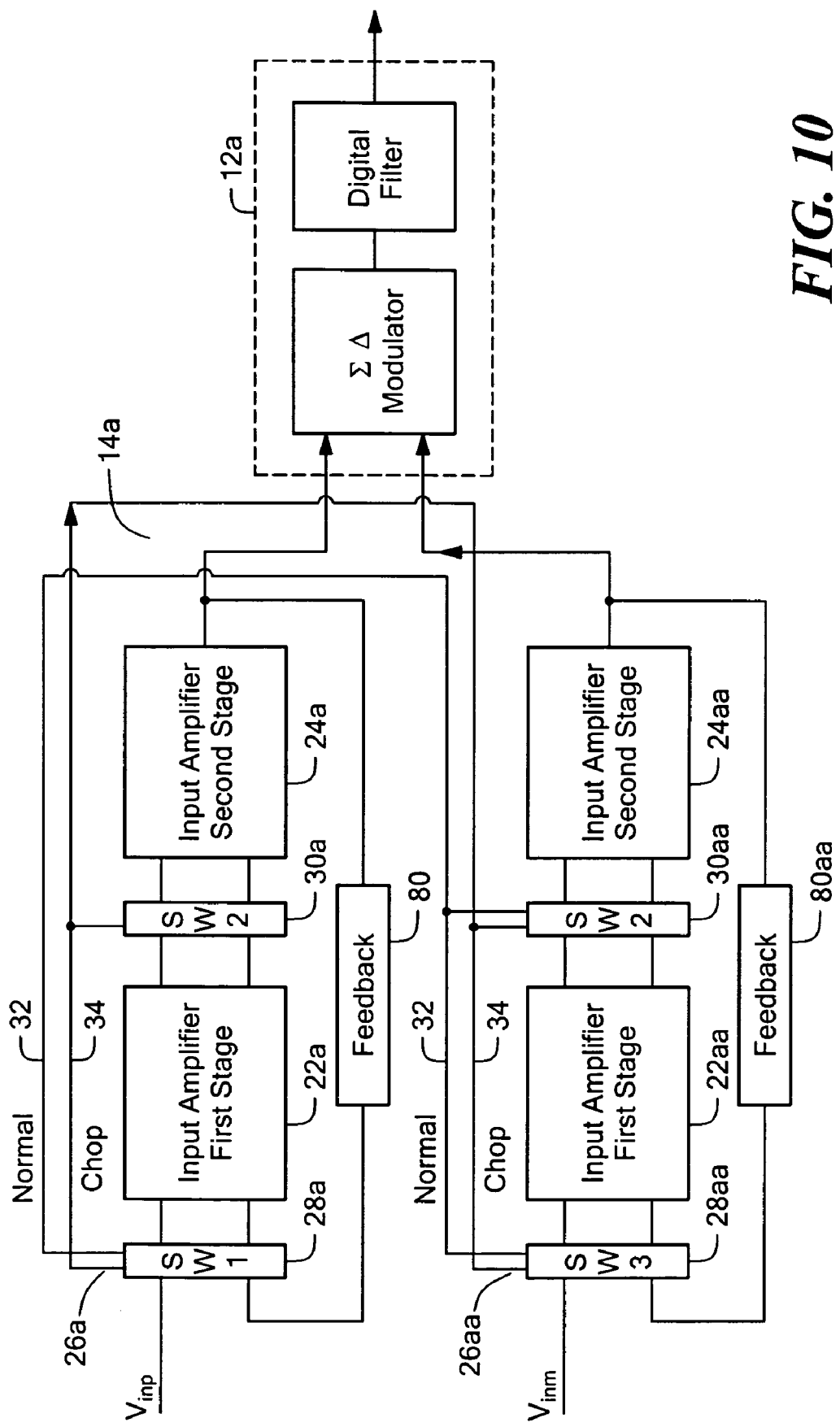
FIG. 10 is a view similar to FIGS. 1 and 2 in which the input amplifier includes a pair of input amplifier circuits each having a chopper circuit for alternately inverting the polarity of an input error of the respective amplifier into positive and negative error components and in which the analog to digital converter includes a differential input.

The invention is not limited to the embodiment shown in FIGS. 1–8. For example, input amplifier 14*a*, FIG. 10, may include a pair of input buffer amplifiers 22*a*, 22*aa* each with chopper circuits 26*a* and 26*aa*, respectively, both chopper circuits being operated by normal signal 32 and chop signal 34. The timing of signals 32 and 34 is in accordance with the digital filter weightings as in earlier embodiments. This configuration is suitable for use where a differential signal is required at the input of analog-to-digital converter 12*a*. The errors in each amplifier 22*a* and 22*aa* are cancelled independently.

In yet another embodiment the buffers may be interchanged instead of flipping over. For example, input amplifier 14*a*, FIG. 11, may include a pair of input buffer amplifiers 22*a*, 22*aa* and chopper circuit 26*a* including switching circuits 28*a* and 30*a* wherein not the input and output of a single amplifier but the connections of the buffer amplifier themselves are swapped by the chopper circuit, having the effect of interchanging the input buffer amplifiers 22*a*, 22*aa*. Thus in the normal mode switches 40*a*, 42*a*, 48*a* and 50*a* are closed while 44*a*, 46*a*, 52*a* and 54*a* are open so that amplifier 22*a* (with offset $V_{osp}$) is connected to $V_{inp}$, and amplifier 22*aa* (with offset $V_{osm}$) is connected to $V_{inm}$. The input $V_{in}$ to digital converter 12*a* is $$V_{in} = V_{inp} + V_{osp} - (V_{inm} + V_{osm}) \tag{1}$$

$$V_{in} = (V_{inp} - V_{inm}) + (V_{osp} - V_{osm}) \tag{2}$$

showing that the net offset is ($V_{osp} - V_{osm}$). In the chop mode, FIG. 12, switches 40*a*, 42*a*, 48*a*, and 50*a* are open and 44*a*, 46*a*, 52*a*, and 54*a* are closed. Amplifier 22*a* is now connected to $V_{inm}$, and amplifier 22*aa* is connected to $V_{inp}$. The input $V_{in}$ to digital converter 12*a* is $$V_{in} = V_{inp} + V_{osm} - (V_{inm} + V_{osp}) \tag{3}$$

$$V_{in} = V_{inp} - V_{inm} + (V_{osm} - V_{osp}) \tag{4}$$

showing now the net offset is ($V_{osm} - V_{osp}$) the same as before but with the polarity reversed.

As in the case of the earlier chopping approach, the chop timing (amplifier swap timing) can be chosen with regard to the filter weightings so that the buffer offset components are cancelled.

Figure 13:
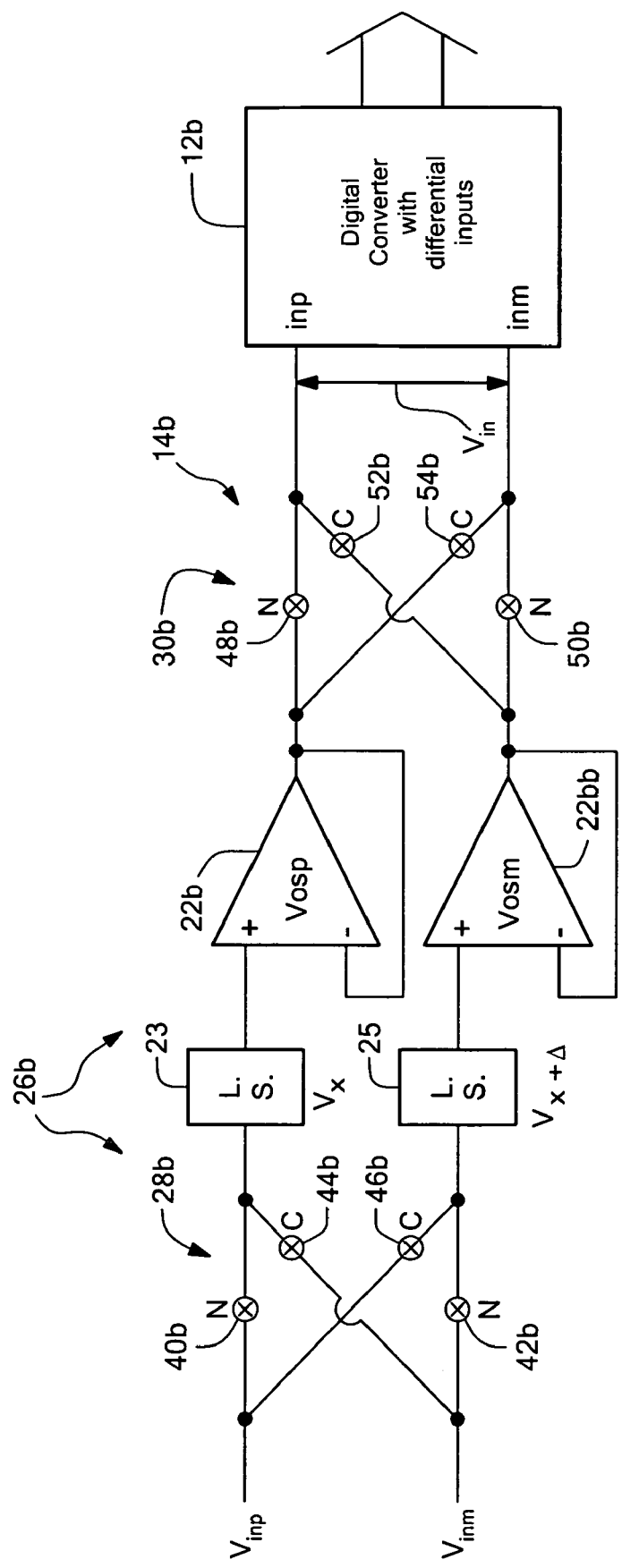
FIG. 13 is a schematic block diagram of yet another alternative embodiment of the input amplifier of FIG. 1.

In yet another approach according to this invention the input amplifier 14*b*, FIG. 13, includes a level shifter 23, 25 associated with each buffer amplifier 22*b*, 22*bb*. Level shifter 23 has an output equal to the input plus $V_x$; level shifter 25 has an output equal to the input plus $V_x$ plus Δ where Δ is the mismatch (offset) voltage. Then in the normal cycle the input $V_{in}$ to digital converter 12*b* is:

$$= V(inp) - V(inm) \tag{5}$$

$$= V_{inp} + V_x + V_{osp} - V_{inm} - V_x - \Delta - V_{osm} \tag{6}$$

$$= (V_{inp} - V_{inm}) - \Delta + (V_{osp} - V_{osm}) \tag{7}$$

and in the chop cycle input $V_{in}$ to digital converter 12*b* is:

$$= V(inp) - V(inm) \tag{8}$$

$$= V_{inp} + V_x + \Delta + V_{osm} - V_{inm} - V_x - V_{osp} \tag{9}$$

$$= (V_{inp} - V_{inm}) + \Delta + (V_{osm} - V_{osp}) \tag{10}$$

The mismatch term Δ and the offset terms change polarity: the offset and the level shifter mismatch are both cancelled. An example of a level shifter circuit would be a source follower circuit. A level shifter is typically used in cases where the amplifier is powered from a single-sided supply, e.g. 0 to 5V or 0 to 3 v, and where the input signal is at ground or below ground. An amplifier can typically work to a minimum input voltage of 100 mV above it's negative supply (in this case ground), therefore limiting the input signal to greater than 100 mV. In many applications (e.g. low side current sensing) it is necessary to work with an input voltage of 0V or even 200–300 mV below 0 v. One approach to handling this input range in the single supply system is to level shift the input, for example by +500 mV, so that the −300 mV input effectively becomes +200 mV, within the range of the amplifier. This can be done by a source follower stage in the amplifier front end. Chopping can then be used to remove any offset caused by this source follower as discussed herein.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A reduced chop rate analog to digital converter system comprising:
   an analog to digital converter including a sampling quantizer circuit and a digital filter which selectively weights its input samples in accordance with its time response;
   an input amplifier for coupling an input signal to the analog to digital converter including a chopper circuit for alternately inverting the polarity of an input error into positive and negative error components; and
   a chopper timer for defining a plurality of time response intervals of said digital filter and for driving said chopper circuit to generate said positive and negative error components in which the sum of the filter weights of the samples of said positive and negative error components are substantially equal.

2. The reduced chop rate analog to digital converter system of claim 1 in which said input amplifier is a unity gain buffer.

3. The reduced chop rate analog to digital converter system of claim 1 in which said input amplifier has a gain magnitude of greater than one.

4. The reduced chop rate analog to digital converter system of claim 1 in which said sampling quantizer circuit includes a $\Sigma \Delta$ modulator.

5. The reduced chop rate analog to digital converter system of claim 1 in which said digital filter includes a sinc (sine x/x) filter.

6. The reduced chop rate analog to digital converter system of claim 5 in which said digital filter includes a fourth order sinc filter.

7. The reduced chop rate analog to digital converter system of claim 1 in which said input error includes 1/f for flicker noise.

8. The reduced chop rate analog to digital converter system of claim 1 in which said input error includes offset error.

9. The reduced chop rate analog to digital converter system of claim 1 in which said chopper timer includes a sample counter responsive to a convert start signal to count sample clock signals to define said time response intervals.

10. The reduced chop rate analog to digital converter system of claim 9 in which said chopper timer includes a decoder circuit responsive to said time response intervals for generating normal and chop signals to drive said chopper circuit to generate said positive and negative components in a plurality of time response intervals.

11. The reduced chop rate analog to digital converter system of claim 1 in which said chopper circuit includes first and second switching circuits.

12. The reduced chop rate analog to digital converter system of claim 9 in which said sample counter is integral with said digital filter.

13. The reduced chop rate analog to digital converter system of claim 1 in which said input amplifier includes a pair of input amplifier circuits, said analog to digital converter includes a differential input and said chopper circuit alternately swaps the interconnection of said input amplifier circuits with said differential inputs of said analog to digital converter.

14. The reduced chop rate analog to digital converter system of claim 13 in which said input amplifier includes a pair of level shifter circuits one associated with each of said input amplifier circuits.

15. The reduced chop rate analog to digital converter system of claim 1 in which said time response intervals are equal.

16. The reduced chop rate analog to digital converter system of claim 1 in which said time response intervals are unequal.

17. The reduced chop rate analog to digital converter system of claim 1 in which said input amplifier includes a pair of input amplifier circuits each having a chopper circuit for alternately inverting the polarity of an input error of the respective amplifier into positive and negative error components and said analog to digital converter includes a differential input.

18. A method of analog to digital conversion for canceling input error comprising:
    selectively weighting input samples in accordance with the time response of a digital filter;
    alternately inverting the polarity of an input error into positive and negative components;
    providing a timing signal for generating the positive and negative components in a plurality of time response intervals of the digital filter in which the sum of the weights of the positive and negative error components are substantially equal.

19. A reduced chop rate analog to digital converter system comprising:
    an analog to digital converter including a sampling quantizer circuit and a digital filter which selectively weights its input samples in accordance with its time response;
    an input amplifier for coupling an input signal to the analog to digital converter including a chopper circuit for alternately inverting the polarity of an input error into positive and negative error components; and
    a chopper timer for defining a plurality of time response intervals of said digital filter and for driving said chopper circuit to generate said positive and negative error components in which the sum of the filter weights of the samples of said positive and negative error components are substantially equal; said input amplifier including a pair of input amplifier circuits, said analog to digital converter including a differential input and said chopper circuit alternately swapping the interconnection of said input amplifier circuits with said differential inputs of said analog to digital converter.

20. A reduced chop rate analog to digital converter system comprising:
    an analog to digital converter including a sampling quantizer circuit and a digital filter which selectively weights its input samples in accordance with its time response;
    an input amplifier for coupling an input signal to the analog to digital converter including a chopper circuit for alternately inverting the polarity of an input error into positive and negative error components; and
    a chopper timer for defining a plurality of time response intervals of said digital filter and for driving said chopper circuit to generate said positive and negative error components in which the sum of the filter weights of the samples of said positive and negative error components are substantially equal; said input amplifier including a pair of input amplifier circuits, said analog to digital converter including a differential input and said chopper circuit alternately swapping the interconnection of said input amplifier circuits with said differential inputs of said analog to digital converter; said input amplifier including a pair of level shifter circuits one associated with each of said input amplifier circuits.

21. A reduced chop rate analog to digital converter system comprising:
   an analog to digital converter including a sampling quantizer circuit and a digital filter which selectively weights its input samples in accordance with its time response;
   an input amplifier for coupling an input signal to the analog to digital converter including a chopper circuit for alternately inverting the polarity of an input error into positive and negative error components; and
   a chopper timer for defining a plurality of time response intervals of said digital filter and for driving said chopper circuit to generate said positive and negative error components in which the sum of the filter weights of the samples of said positive and negative error components are substantially equal; said input amplifier including a pair of input amplifier circuits each having a chopper circuit for alternately inverting the polarity of an input error of the respective amplifier into positive and negative components, and where said analog to digital converter includes a differential input.

22. A reduced chop rate analog to digital converter system comprising:
   an analog to digital converter including a sampling quantizer circuit and a digital filter which selectively weights its input samples in accordance with its time response;
   an input amplifier for coupling an input signal to the analog to digital converter including a chopper circuit for alternately inverting the polarity of an input error into positive and negative error components; and
   a chopper timer for defining a plurality of time response intervals of said digital filter and for driving said chopper circuit to generate said positive and negative error components in which the sum of the filter weights of the samples of said positive and negative error components are substantially equal, said chopper timer including a sample counter responsive to a convert start signal to count sample clock signals to define said time response intervals.

23. The reduced chop rate analog to digital converter system of claim 22 in which said chopper timer includes a decoder circuit responsive to said time response intervals for generating normal and chop signals to drive said chopper circuit to generate said positive and negative components in a plurality of time response intervals.

24. The reduced chop rate analog to digital converter system of claim 22 in which said sample counter is integral with said digital filter.

25. A reduced chop rate analog to digital converter system comprising:
   an analog to digital converter including a sampling quantizer circuit and a digital filter which selectively weights its input samples in accordance with its time response;
   an input amplifier for coupling an input signal to the analog to digital converter including a chopper circuit for alternately inverting the polarity of an input error into positive and negative error components, said input amplifier including a pair of input amplifier circuits, said analog to digital converter including a differential input and said chopper circuit alternately swaps the interconnection of said input amplifier circuits with said differential inputs of said analog to digital converter, said input amplifier including a pair of level shifter circuits one associated with each of said input amplifier circuits; and
   a chopper timer for defining a plurality of time response intervals of said digital filter and for driving said chopper circuit to generate said positive and negative error components in which the sum of the filter weights of the samples of said positive and negative error components are substantially equal.

* * * * *